United States Patent
Sakura (10) Patent No.: US 7,449,669 B2
(45) Date of Patent: Nov. 11, 2008

(54) RECEIVING APPARATUS

(75) Inventor: Shigeyuki Sakura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/548,412

(22) Filed: Oct. 11, 2006

(65) Prior Publication Data

US 2007/0126507 A1     Jun. 7, 2007

(30) Foreign Application Priority Data

Oct. 14, 2005     (JP)     ............... 2005-300231

(51) Int. Cl.
*H01J 40/14*     (2006.01)
*H03F 3/08*     (2006.01)

(52) U.S. Cl. ............... 250/214 A; 250/214 LA; 250/214 R; 330/308

(58) Field of Classification Search ............ 250/214 R, 250/214 A, 214 LA, 214 AG, 214 DC; 330/308, 330/254, 59, 110; 327/514
See application file for complete search history.

(56) References Cited

U.S. PATENT DOCUMENTS 4,431,916 A     2/1984     Couch
5,247,211 A     9/1993     Sakura
5,955,921 A     9/1999     Ide et al.
6,072,366 A *     6/2000     Maeda et al. ............... 330/308
6,885,249 B2     4/2005     Suzunaga

FOREIGN PATENT DOCUMENTS

JP     57-192155     11/1982
JP     8-163054     6/1996

* cited by examiner

*Primary Examiner*—Kevin Pyo
(74) *Attorney, Agent, or Firm*—Oblon, Spivak, McClelland, Maier & Neustadt, P.C.

(57) ABSTRACT

There may be provided a receiving apparatus including: a light receiving element which receives an optical signal and generates a current signal dependent on the optical signal; a conversion unit which converts the current signal into a voltage signal; a reference voltage generation unit which generates a reference voltage; a threshold voltage generation unit which generates, based on the voltage signal outputted from the conversion unit and the reference voltage outputted from the reference voltage generation unit, a threshold voltage signal having an amplitude smaller than an amplitude of the voltage signal with reference to substantially the center of amplitude range of the voltage signal and delayed by a predetermined time period from the voltage signal; and a comparison unit which compares the voltage signal outputted from the conversion unit with the threshold voltage signal outputted from the threshold voltage generation unit.

14 Claims, 7 Drawing Sheets

RECEIVING APPARATUS

CROSS REFERENCE TO RELATED APPLICATIONS

This application is based upon and claims benefit of priority under 35 USC 119 from the Japanese Patent Application No. 2005-300231, filed on Oct. 14, 2005, the entire contents of which are incorporated herein by reference.

BACKGROUND

There is a receiving apparatus which receives by use of a light receiving element an optical signal transmitted from a light emitting element Such receiving apparatus converts a current signal obtained by receiving an optical signal into a voltage signal and compares the voltage signal with a predetermined threshold voltage to thereby generate and output a digital signal In this case, there has been proposed that the receiving apparatus uses as threshold voltage a voltage corresponding to half of a peak voltage of the voltage signal (for example, refer to Japanese Patent Laid-Open No. 57-192155).

SUMMARY

A receiving apparatus according to one aspect of the present invention includes: a light receiving element which receives an optical signal and generates a current signal dependent on the optical signal; a conversion unit which converts the current signal into a voltage signal; a reference voltage generation unit which generates a reference voltage; a threshold voltage generation unit which generates, based on the voltage signal outputted from the conversion unit and the reference voltage outputted from the reference voltage generation unit, a threshold voltage signal having an amplitude smaller than an amplitude of the voltage signal with reference to substantially the center of amplitude range of the voltage signal and delayed by a predetermined time period from the voltage signal; and a comparison unit which compares the voltage signal outputted from the conversion unit with the threshold voltage signal outputted from the threshold voltage generation unit.

Also, a receiving apparatus according to one aspect of the present invention includes: a light receiving element which receives an optical signal and generates a current signal dependent on the optical signal; a conversion unit which converts the current signal into a voltage signal; a reference voltage generation unit which generates a reference voltage; a threshold voltage generation unit which generates a threshold voltage signal based on the voltage signal outputted from the conversion unit and the reference voltage outputted from the reference voltage generation unit; and a comparison unit which compares the voltage signal outputted from the conversion unit with the threshold voltage signal outputted from the threshold voltage generation unit, wherein the threshold voltage generation unit includes: a level shift circuit which subtracts an offset voltage from the voltage signal and thereby lowers the voltage signal by the offset voltage; a peak hold circuit which is connected to an output end of the level shift circuit and holds a peak voltage of the voltage signal being the result of subtracting the offset voltage at a desired time constant; a resistor which is connected between an output end of the reference voltage generation unit and an output end of the peak hold circuit; and a current source circuit which is connected to the output end of the peak hold circuit and causing the offset voltage to be generated between both ends of the resistor.

DETAILED DESCRIPTION OF THE INVENTION

Embodiments of the present invention will be described below with reference to the drawings.

First Embodiment

Figure 1:
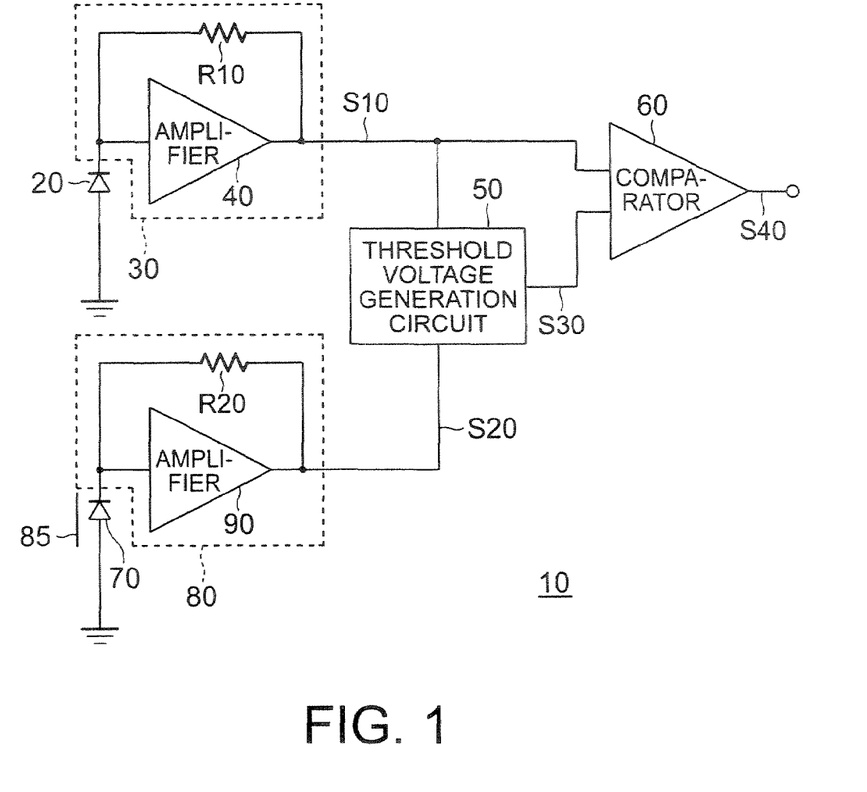
FIG. 1 is a block diagram showing a configuration of a receiving apparatus according to a first embodiment.
Figure 2:
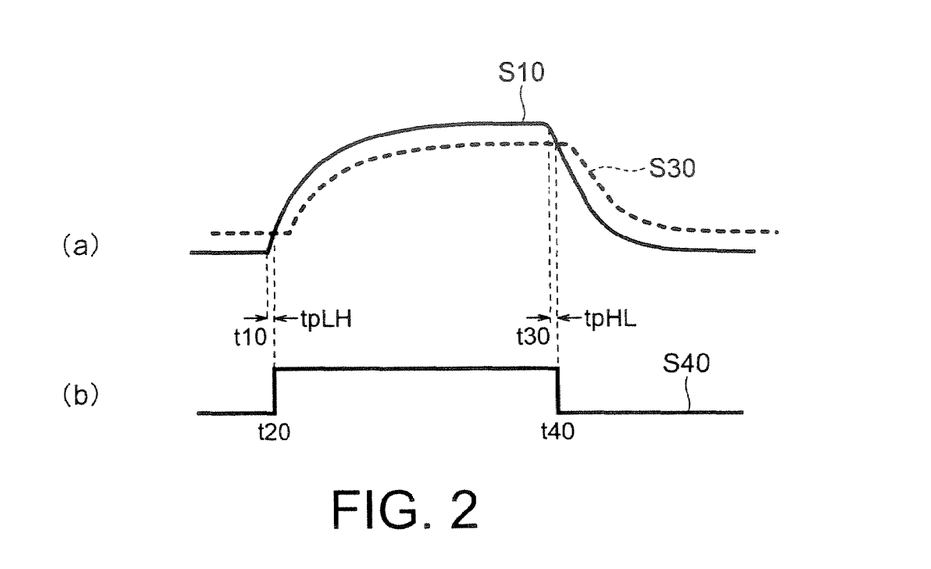
FIG. 2 shows signal waveforms of each signal obtained in the receiving apparatus.

FIG. 1 shows a configuration of a receiving apparatus 10 according to a first embodiment. FIG. 2 shows signal waveforms of each signal obtained in the receiving apparatus 10. The receiving apparatus 10 is used, for example in a receiving end such as a photo coupler or an optical transmission module transmitting an optical signal between a light emitting element and receiving element.

The receiving apparatus 10 has a photodiode 20 as a light receiving element. An anode of the photodiode 20 is connected to ground GND, and a cathode thereof is connected to an input terminal of a trans-impedance amplifier (TIA) 30.

In the receiving apparatus 10, an optical signal generated by a light emitting element of a transmitting apparatus not shown and transferred is received by the photodiode 20. This optical signal has rectangular shaped pulse; for example, "H" level is generated by causing the light emitting element to output light, and "L" level is generated by causing the light emitting element not to output light.

The photodiode 20 generates a current signal dependent on the optical signal received and outputs this to the trans-impedance amplifier 30. The trans-impedance amplifier 30 is constituted of a resistor R10 connected between an input and output terminal of an amplifier 40, and converts the supplied current signal into a voltage signal S10 (FIG. 2(A)) and outputs this to a threshold voltage generation circuit 50 and a first input terminal of a comparator 60.

In the present embodiment, as, a reference voltage generation unit there are provided a light shielding unit 85, a dummy photodiode 70 and a dummy trans-impedance amplifier (dummy TIA) 80.

The light shielding unit 85 is so disposed that the dummy photodiode 70 receives no optical signal. Similarly to the trans-impedance amplifier 30, the dummy trans-impedance amplifier 80 is constituted of a resistor R20 connected between an input and output terminal of an amplifier 90, and generates a reference potential corresponding to "L" level of the voltage signal S10 outputted from the trans-impedance amplifier 30 and outputs a resultant voltage signal S20 to the threshold voltage generation circuit 50.

The threshold voltage generation circuit 50 generates, based on the voltage signal S10 (FIG. 2(A)) having a signal waveform corresponding to the optical signal and the voltage signal S20 consisted of a reference voltage, a threshold voltage signal S30 (FIG. 2(A)) having an amplitude smaller than that of the voltage signal S10 (FIG. 2(A)) with reference to substantially the center of amplitude range of the voltage signal S10 (FIG. 2(A)), and delayed by a predetermined time period from the voltage signal S10 (FIG. 2(A)), and outputs this to a second input terminal of the comparator 60.

More specifically, the threshold voltage generation circuit 50 includes: a level shift circuit which adds an offset voltage to the voltage signal S20 being the reference potential and thereby raises the voltage signal S10 (FIG. 2(A)) by the offset voltage; a voltage dividing circuit which divides the voltage signal S10 (FIG. 2(A)) and thereby reduces the signal level of the voltage signal S10 (FIG. 2(A)); and a delay circuit which delays the voltage signal S10 (FIG. 2(A)) by a predetermined time period.

Accordingly, the threshold voltage generation circuit 50 generates the threshold voltage signal S30 (FIG. 2(A)) having a reference voltage higher by the offset voltage than that of the voltage signal S10 (FIG. 2(A)) and at the same time, having a signal level smaller than that of the voltage signal S10 (FIG. 2(A)), and further, delayed by the predetermined time period.

The comparator 60 compares the voltage signal S10 (FIG. 2(A)) and the threshold voltage signal S30 (FIG. 2(A)), and generates a voltage signal S40 (FIG. 2(B)) which changes from "L" level to "H" level at a timing t20 when the voltage signal S10 (FIG. 2(A)) exceeds the threshold voltage signal S30 (FIG. 2(A)), and changes from "H" level to "L" level at a timing t40 when the voltage signal S10 (FIG. 2(A)) falls below the threshold voltage signal S30 (FIG. 2(A)).

Here, a time period from a timing t10 when the optical signal S10 (FIG. 2(A)) begins to rise to a timing t20 when the voltage signal S40 (FIG. 2(B)) changes from "L" level to "H" level is referred to as propagation delay time to logic low output tpLH; a time period from a timing t30 when the optical signal S10 (FIG. 2(A)) begins to fall to a timing t40 when the voltage signal S40 (FIG. 2(B)) changes from "H" level to "L" level is referred to as propagation delay time to logic high output tpHL.

In this manner, according to the present embodiment, when the voltage signal S10 rises, a voltage smaller than half of a peak voltage of the voltage signal S10 is used as a threshold voltage; when the voltage signal S10 falls, a voltage larger than half of the peak voltage of the voltage signal S10 is used as a threshold voltage.

Accordingly, compared to when half of a peak voltage is used as a constant threshold voltage, propagation delay time to logic low output tpLH and propagation delay time to logic high output tpHL can be reduced.

Figure 3:
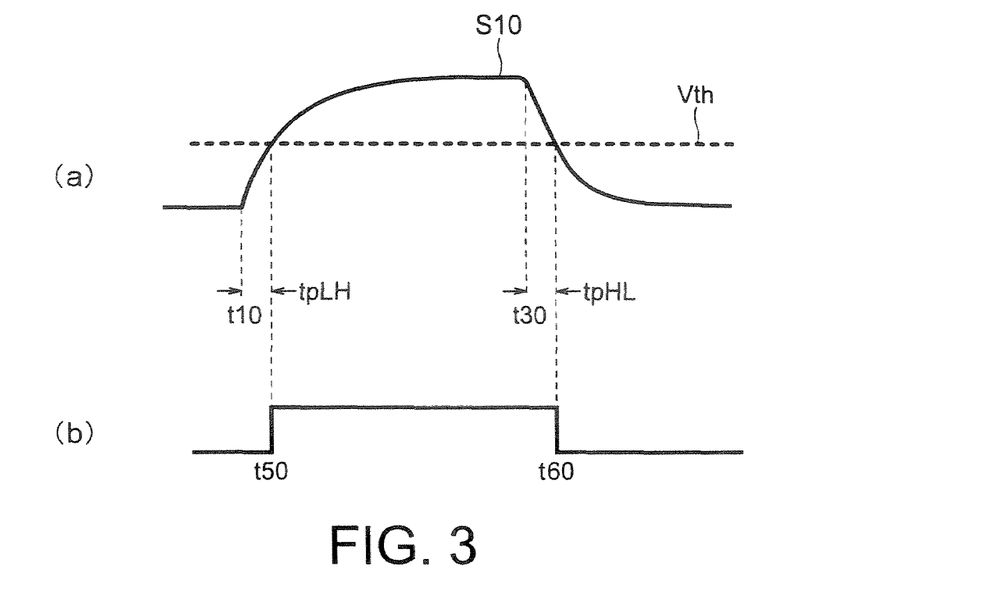
FIG. 3 shows signal waveforms of each signal obtained in a receiving apparatus being a comparative example.

FIG. 3 shows, as a comparative example, the waveforms of the signals obtained when half of a peak voltage of the voltage signal S10 (FIG. 3(A)) is used as a constant threshold voltage.

In this comparative example, the voltage signal (FIG. 3(B)) outputted from the comparator 60 changes from "L" level to "H" level at a timing t50 when the voltage signal S10 (FIG. 3(A)) exceeds a threshold voltage Vth (FIG. 3(A)), and changes from "H" level to "L" level at a timing t60 when the voltage signal S10 (FIG. 3(A)) falls below the threshold voltage Vth (FIG. 3(A)).

As in this comparative example, when half of a peak voltage of voltage signal S10 (FIG. 3(A)) is used as the threshold voltage Vth, if the voltage signal S10 gradually rises and falls, propagation delay time to logic low output tpLH and propagation delay time to logic high output tpHL lengthen. In contrast, according to the present embodiment, compared to this comparative example, both propagation delay time to logic low output tpLH and propagation delay time to logic high output tpHL can be shortened.

Figure 4:
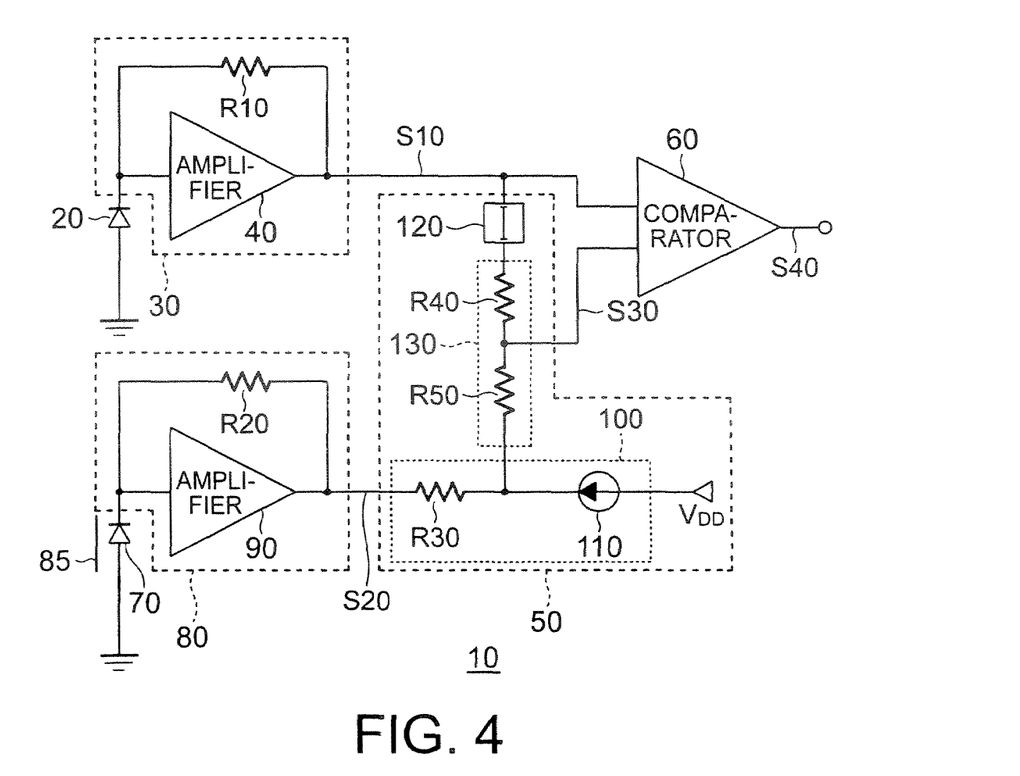
FIG. 4 is a block diagram showing a configuration of the receiving apparatus according to the first embodiment.

Here, FIG. 4 shows a configuration of the threshold voltage generation circuit 50. As shown in FIG. 4, the threshold voltage generation circuit 50 includes a level shift circuit 100, a delay circuit 120 and a voltage dividing circuit 130. More specifically, between a power source terminal $V_{DD}$ and an output terminal of a dummy trans-impedance amplifier 80, there is connected the level shift circuit 100. The level shift circuit 100 is constituted of a series circuit of a constant current source 110 and a resistor R30.

The delay circuit 120 is connected to an output terminal of the trans-impedance amplifier 30. Between the delay circuit 120 and a connection point between the constant current source 110 and the resistor R30, there is connected the voltage dividing circuit 130. The voltage dividing circuit 130 is constituted of a series circuit of resistors R40 and R50. A second input terminal of the comparator 60 is connected to a connection point between these resistors R40 and R50.

In this case, in the threshold voltage generation circuit 50, the level shift circuit 100 adds an offset voltage to the voltage signal S20 consisted of a reference voltage, and the delay circuit 120 delays the voltage signal S10 (FIG. 2(A)) by a predetermined time period In the threshold voltage generation circuit 50, the voltage dividing circuit 130 divides the voltage signal S20 being the result of adding the offset voltage and the voltage signal S10 (FIG. 2(A)) delayed by the predetermined time period, and thereby generates the threshold voltage signal S30 (FIG. 2(A)).

If any current flows from the dummy trans-impedance amplifier 80 into the level shift circuit 100 and thus, there occurs a variation in the voltage generated in the level shift circuit 100, a buffer amplifier may be connected between the dummy trans-impedance amplifier 80 and the level shift circuit 100

Also, the delay circuit 120 may be constituted of a low-pass filter, for example composed of a resistor and capacitor. In this case, as for the time constant, a selection is so made that a shorter time constant is provided than a minimum pulse width of the voltage signal S10.

Figure 5:
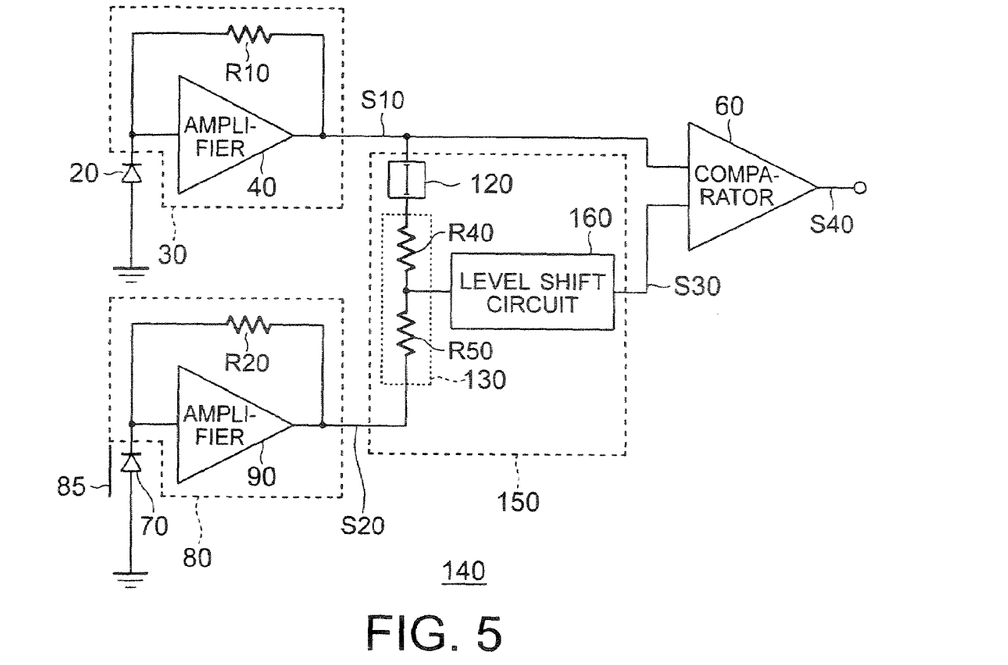
FIG. 5 is a block diagram showing a configuration of a receiving apparatus according to another embodiment.

The above described first embodiment is an example, and the present invention is not limited thereto. For example, as shown in FIG. 5, it is possible that, between an output terminal of a trans-impedance amplifier 30 and an output terminal of a dummy trans-impedance amplifier 80, there is connected in series a delay circuit 120 and a voltage dividing circuit 130, and between a connection point between resistors R40 and R50 constituting the voltage dividing circuit 130 and a second input terminal of a comparator 60, there is connected a level shift circuit 160, thereby constituting a threshold voltage generation circuit 150.

In this case, in the threshold voltage generation circuit 150, the delay circuit 120 delays a voltage signal S10 (FIG. 2(A)) by a predetermined time period, and then the voltage dividing circuit 130 divides the delayed voltage signal S10 (FIG. 2(A)) and a voltage signal S20 consisted of a reference voltage, and the level shift circuit 100 adds an offset voltage to a voltage signal being the result of being divided, thereby generating a threshold voltage signal S30 (FIG. 2(A)).

Figure 6:
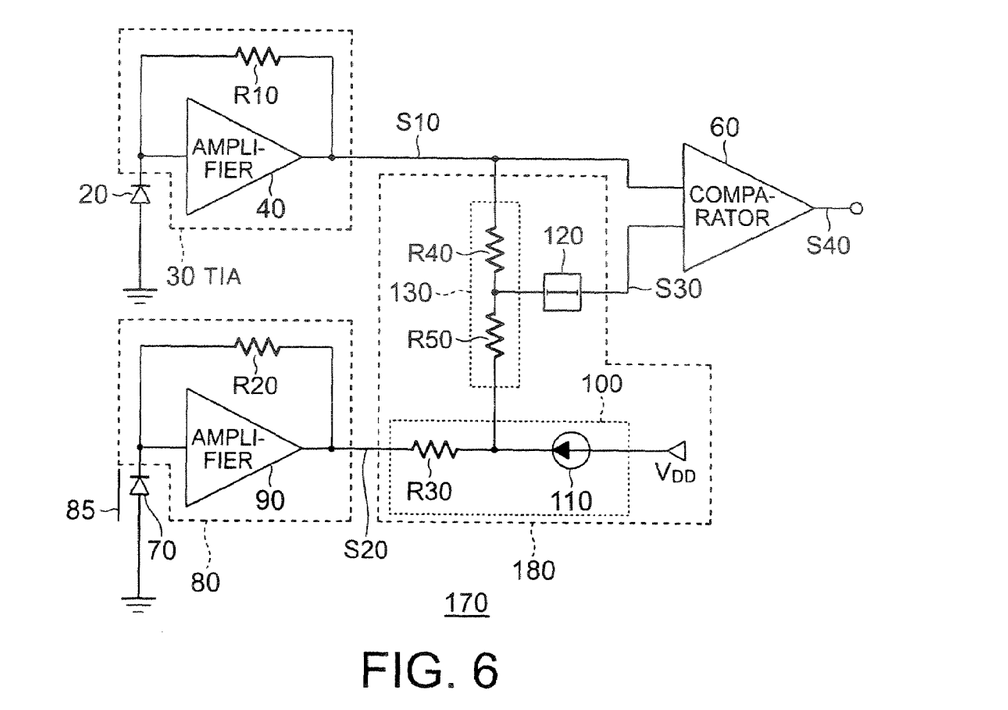
FIG. 6 is a block diagram showing a configuration of a receiving apparatus according to another embodiment.

Also, as shown in FIG. 6, it is possible that, to an output terminal of a dummy trans-impedance amplifier 80, there is connected a level shift circuit 100, and between a connection point between a constant current source 110 and a resistor R30 constituting the level shift circuit 100 and an output terminal of a trans-impedance amplifier 30, there is connected a voltage dividing circuit 130, and further, between a connection point between resistors R40 and R50 constituting the voltage dividing circuit 130 and a second input terminal of a comparator 60, there is connected a delay circuit 120, thereby constituting a threshold voltage generation circuit 180.

In this case, in the threshold voltage generation circuit 180, the level shift circuit 100 adds an offset voltage to a voltage signal S20 consisted of a reference voltage, and the voltage dividing circuit 130 divides the voltage signal S20 being the result of adding the offset voltage and a voltage signal S10 (FIG. 2(A)), and the delay circuit 120 delays the resultant voltage signal by a predetermined time period, thereby generating a threshold voltage signal S30 (FIG. 2(A)).

Figure 7:
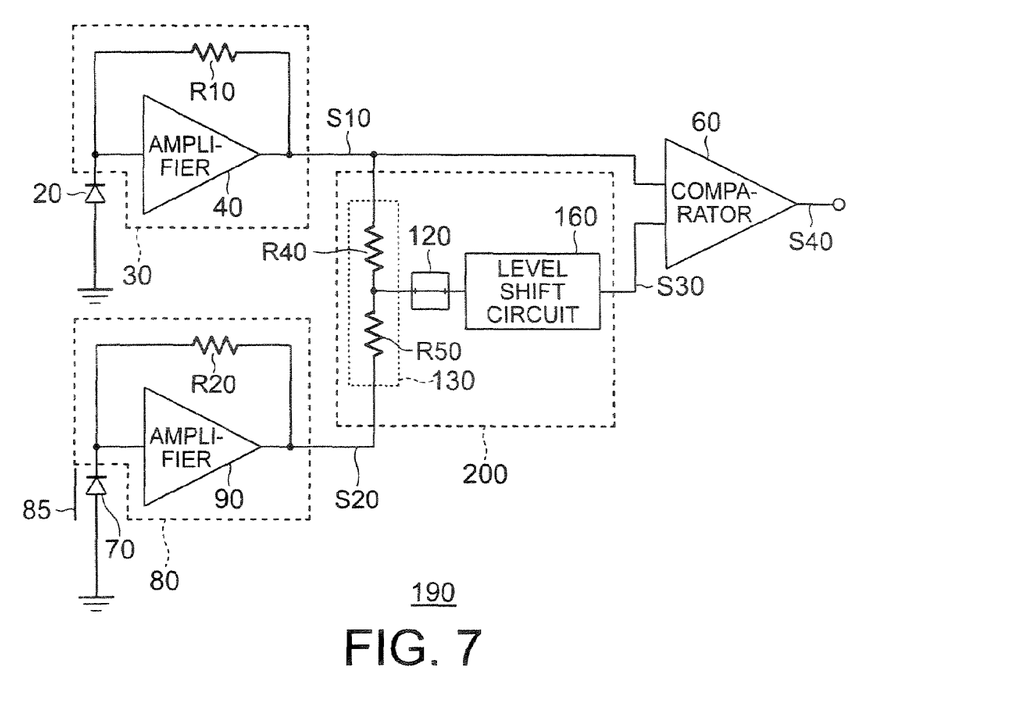
FIG. 7 is a block diagram showing a configuration of a receiving apparatus according to another embodiment.

As shown in FIG. 7, it is possible that, between an output terminal of a trans-impedance amplifier 30 and an output terminal of the dummy trans-impedance amplifier 80, there is connected a voltage dividing circuit 130, and between a connection point between resistors R40 and R50 constituting the voltage dividing circuit 130 and a second input terminal of a comparator 60, there is connected in series a delay circuit 120 and a level shift circuit 160, thereby constituting a threshold voltage generation circuit 200.

In this case, in the threshold voltage generation circuit 200, the voltage dividing circuit 130 divides a voltage signal S10 (FIG. 2(A)) and a voltage signal S20 consisted of a reference voltage and then the delay circuit 120 delays the resultant voltage signal by a predetermined time period and further, the level shift circuit 100 adds an offset voltage, thereby generating a threshold voltage signal S30 (FIG. 2(A)).

Second Embodiment

Figure 8:
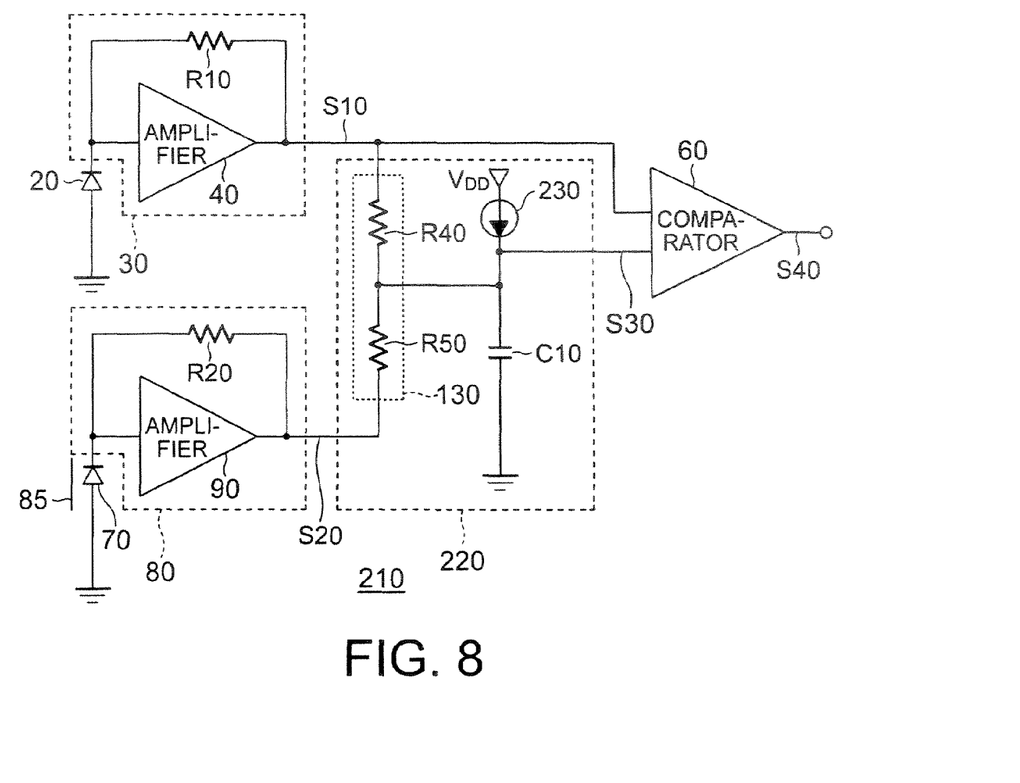
FIG. 8 is a block diagram showing a configuration of a receiving apparatus according to a second embodiment.

FIG. 8 shows a configuration of a receiving apparatus 210 according to a second embodiment. The same reference characters are applied to parts similar to those shown in FIGS. 1 and 4, and an explanation thereof is omitted. Excluding a threshold voltage generation circuit 220, this receiving apparatus 210 has a configuration similar to that of the receiving apparatus 10 (FIGS. 1 and 4).

This threshold voltage generation circuit 220 is constituted as follows. That is, between an output terminal of a trans-impedance amplifier 30 and an output terminal of a dummy trans-impedance amplifier 80, there is connected a voltage dividing circuit 130, and a connection point between resistors R40 and R50 constituting the voltage dividing circuit 130 is connected via a capacitor C10 to ground GND and at the same time, connected via a constant current source 230 to a power source terminal $V_{DD}$ and further connected to a second input terminal of a comparator 60.

In this manner, in order to delay signal transmission, the capacitor C10 is connected to the connection point between the resistors R40 and R50. The resistors R40 and R50 of the voltage dividing circuit 130 and the capacitor C10 operate as a delay circuit.

Also, current flows from the constant current source 230 to the connection point between the resistors R40 and R50 to raise the potential of the connection point. Consequently, the resistors R40 and R50 of the voltage dividing circuit 130 and the constant current source 230 operate as a level shift circuit.

As described above, according to the present embodiment, similarly to the first embodiment, transmission delay time can be shortened. Also, since part of the delay circuit and level shift circuit is shared by the voltage dividing circuit, the configuration of the threshold voltage generation circuit 220 can be simplified, compared to the first embodiment.

Third Embodiment

Figure 9:
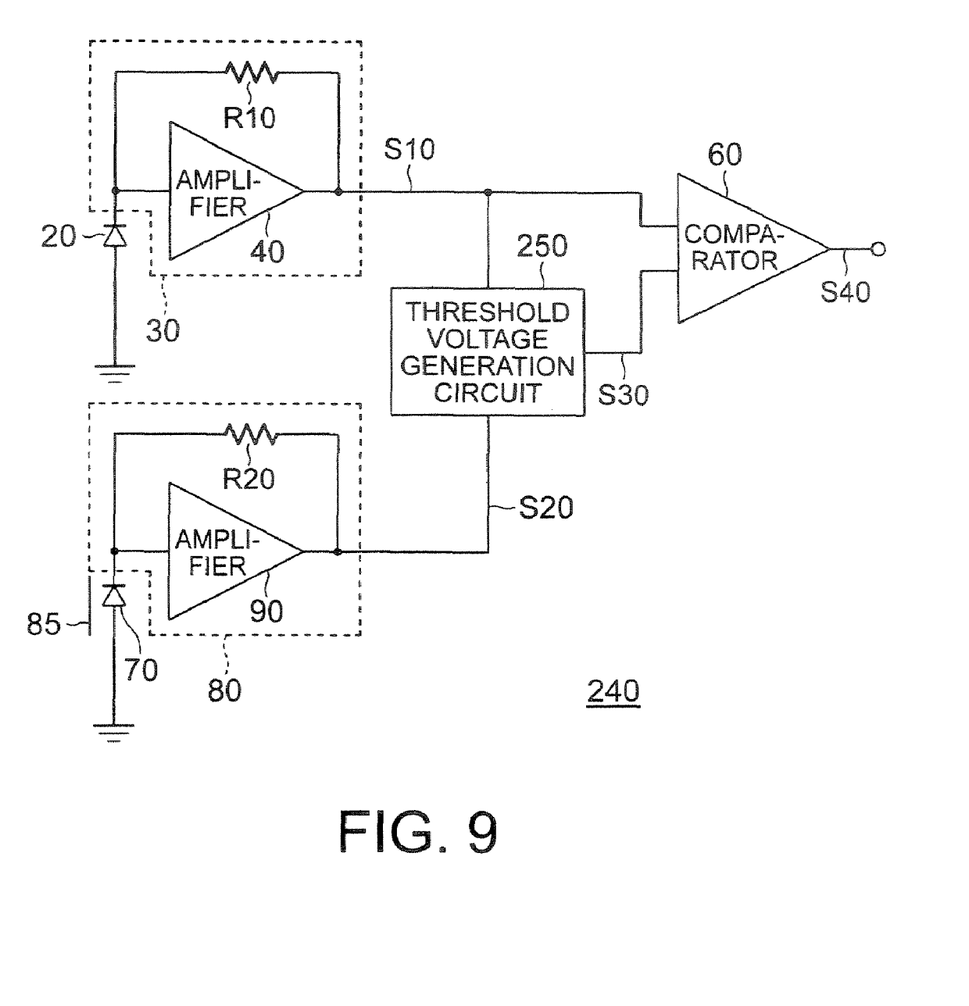
FIG. 9 is a block diagram showing a configuration of a receiving apparatus according to a third embodiment.
Figure 10:
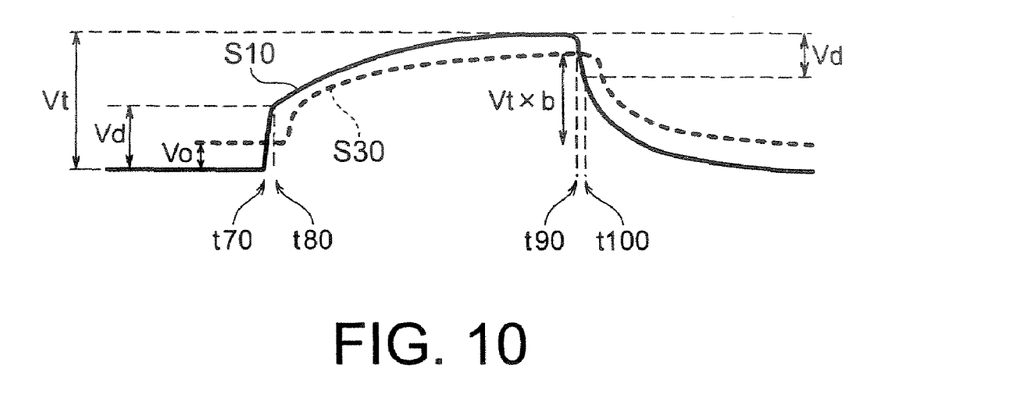
FIG. 10 shows signal waveforms of each signal obtained in the receiving apparatus.

FIG. 9 shows a configuration of a receiving apparatus 240 according to a third embodiment. FIG. 10 shows waveforms of each signal obtained in the receiving apparatus 240. The same reference characters are applied to parts similar to those shown in FIG. 1, and an explanation thereof is omitted. Excluding a threshold voltage generation circuit 250, this receiving apparatus 240 has a configuration similar to that of the receiving apparatus 10 (FIG. 1).

Generally, when a photodiode 20 receives an optical signal, current dependent on the received optical signal flows in the photodiode 20. The current flowing in the photodiode 20 includes drift current generated when carriers are moved by electric field in a depletion layer and diffusion current generated when carriers are moved by concentration gradient in a field excluding the depletion layer.

The thickness of depletion layer of the photodiode 20 is so preferably selected that the optical signal is largely absorbed by the depletion layer. However, in designing the circuit, when the depletion layer of the photodiode 20 is formed with a thickness not sufficiently large to allow the depletion layer to absorb all the optical signal, diffusion current is generated in a field excluding the depletion layer.

Since large electric field is applied to the drift current generated in the depletion layer, the speed thereof is high. In contrast, since only small electric field is applied to the diffusion current generated in the field excluding the depletion layer, the speed thereof is low.

Consequently, when the voltage signal S10 (FIG. 10) outputted from the trans-impedance amplifier 30 rises, it sharply rises first by drift current (time point t70 to t80) and then gradually rises by diffusion current (time point t80 to t90).

When the voltage signal S10 (FIG. 10) falls, similarly to when rising, it sharply falls first by drift current (time point t90 to t100) and then gradually falls by diffusion current (time point t100 or later).

In the threshold voltage generation circuit 250, when the threshold voltage signal S30 (FIG. 10) is generated, an offset voltage $V_O$ is added to the voltage signal S10 (FIG. 10). In the present embodiment, this offset voltage $V_O$ is selected so as to be smaller than voltage $V_d$ generated by drift current of voltage $V_t$ generated by drift current and diffusion current, and at the same time, so that voltage dividing ratio "b" (in this regard, b=R50/(R40+R50)) satisfies the following formula (1)

$$b \geq 1 - (V_O + V_d)/V_t \tag{1}$$

This formula (1) is obtained by expanding the following formula (2)

$$V_O + V_t \times b \geq V_t - V_d \tag{2}$$

As described above, according to the present embodiment, immediately after beginning to rise and immediately after beginning to fall, and at the same time, when the voltage signal S10 (FIG. 10) sharply changes, the voltage signal S10 (FIG. 10) can be compared with the threshold voltage signal S30 (FIG. 10). Accordingly, similarly to the first embodiment, transmission delay time may be shortened.

The third embodiment described above is only an example. The present invention is not limited thereto. For example, when the offset voltage $V_O$ is so selected that voltage dividing ratio b satisfies the following formula (3), $$b=1-2V_O/V_t \quad (3)$$

then the offset voltage used when falling can be made equal to the offset voltage $V_O$ used when rising, thereby allowing suppressing of occurrence of pulse width distortion. This formula (3) is obtained by expanding the following formula (4).

$$V_t-(V_t\times b+V_O)=V_O \quad (4)$$

Fourth Embodiment

Figure 11:
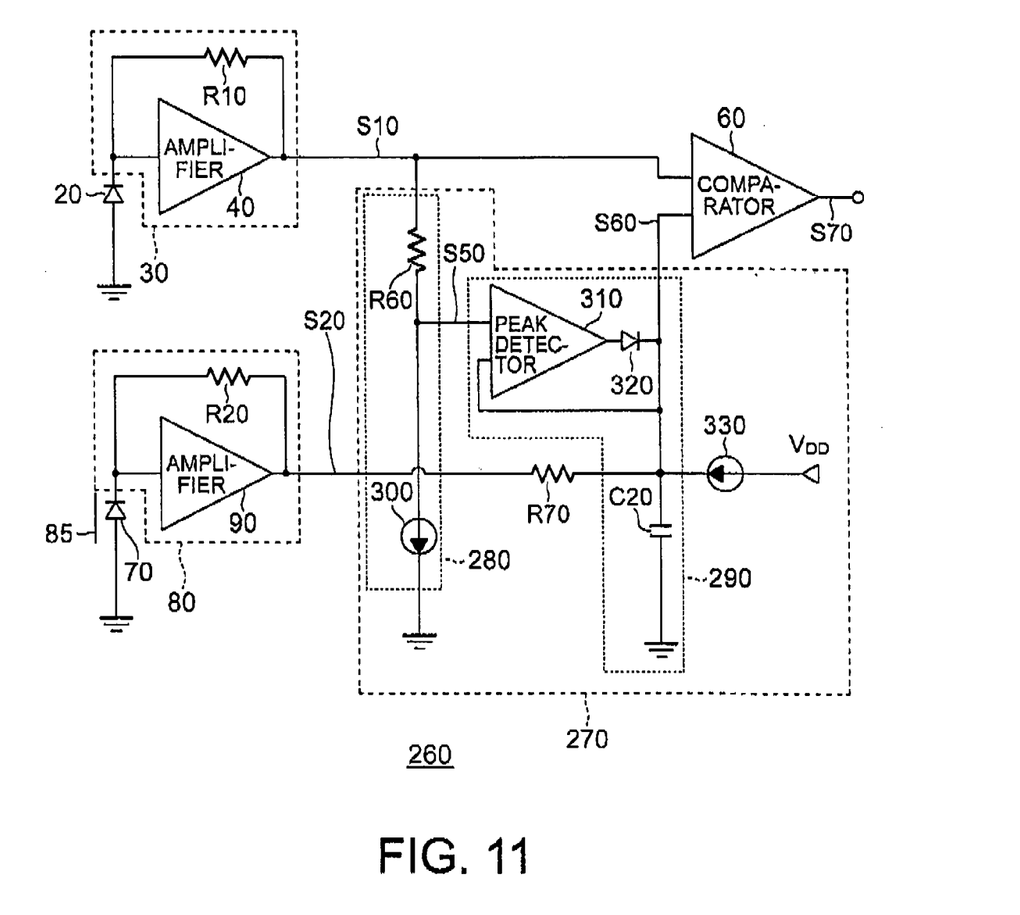
FIG. 11 is a block diagram showing a configuration of a receiving apparatus according to a fourth embodiment.
Figure 12:
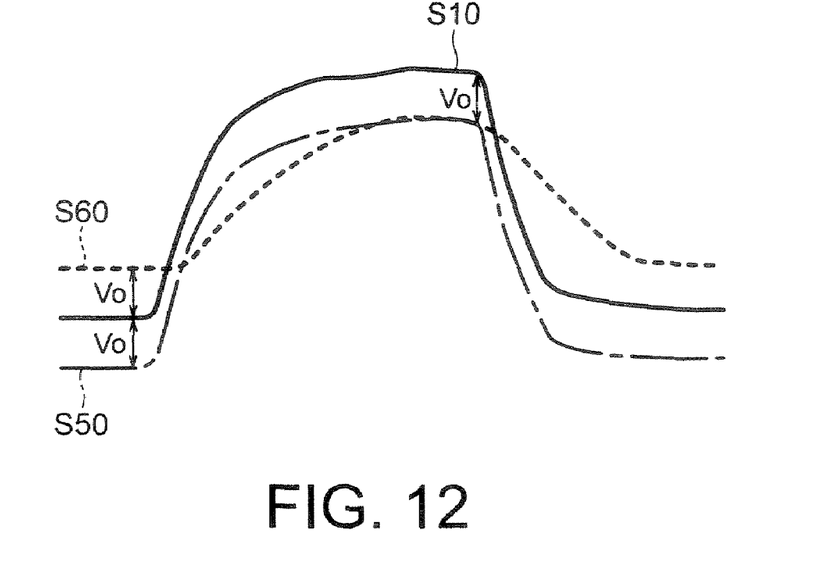
FIG. 12 shows signal waveforms of each signal obtained in the receiving apparatus.

FIG. 11 shows a configuration of a receiving apparatus 260 according to a fourth embodiment. FIG. 12 shows waveforms of each signal obtained in the receiving apparatus 260. The same reference characters are applied to parts similar to those shown in FIG. 1, and an explanation thereof is omitted. Excluding a threshold voltage generation circuit 270, this receiving apparatus 260 has a configuration similar to that of the receiving apparatus 10 (FIG. 1).

In the present embodiment, the threshold voltage generation circuit 270 includes a level shift circuit 280 and a peak hold circuit 290. The level shift circuit 280 is constituted of a series circuit of a resistor R60 and a constant current source 300 and connected between an output terminal of a trans-impedance amplifier 30 and ground GND.

In this level shift circuit 280, an offset voltage $V_O$ is subtracted from a voltage signal S10 (FIG. 12) to generate a voltage signal S50. The voltage S50 is outputted to a first input terminal of a peak detection circuit 310 in the peak hold circuit 290.

The peak hold circuit 290 includes a peak detector 310, a diode 320 and a capacitor C20. The time constant for holding a peak voltage is selected so as to be shorter than a minimum pulse width of the voltage signal S10 (FIG. 12).

Between an output terminal of the peak hold circuit 290 and an output terminal of a dummy trans-impedance amplifier 80, there is connected a resistor R70. Further, between the output terminal of the peak hold circuit 290 and a power source terminal $V_{DD}$, there is connected a constant current source 330. Accordingly, a constant offset voltage $V_O$ is generated at a connection point between the resistor R70 and the constant current source 330, and the constant offset voltage $V_o$ is supplied to a second input terminal of the peak detection circuit 310.

In the peak hold circuit 290, when the offset voltage $V_O$ is higher than the voltage signal S50 (FIG. 12), the offset voltage $V_O$ is outputted; when the voltage signal S50 (FIG. 12) exceeds the offset voltage $V_O$, a threshold voltage signal S60 (FIG. 12) is generated which rises in a manner of following the voltage signal S50 (FIG. 12) and when reaching a voltage lower by the offset voltage $V_O$ than the voltage signal S10 (FIG. 12), held at that voltage and later falls.

As described above, according to the present embodiment, the offset voltage $V_O$ is set to an enough low voltage not to be influenced by effects of noises. Consequently, similarly to the first embodiment, transmission delay time can be shortened. Also, during the rising, the offset voltage $V_O$ is used as threshold voltage, and during the falling, a voltage lower by the offset voltage $V_O$ than a peak voltage of the voltage signal S10 (FIG. 12) is used as threshold voltage. Consequently, transmission delay time observed when rising can be made substantially equal to that observed when falling, thus allowing any pulse width distortion to be reduced.

In a case where a relatively large noise occurs when the voltage signal S10 (FIG. 12) falls, the offset voltage generated by the level shift circuit 280 may be selected so as to be larger than the offset voltage generated by the resistor R70.

Figure 13:
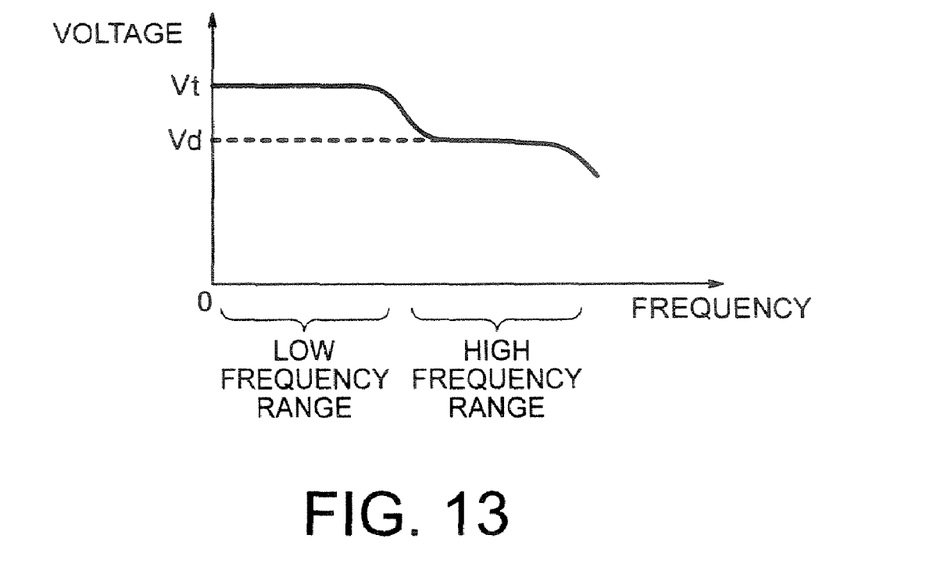
FIG. 13 is a schematic diagram showing a frequency response characteristic of a trans-impedance amplifier.

The above described fourth embodiment is an example, and the present invention is not limited thereto. Generally, as shown in FIG. 13, of the voltage signal S10 (FIG. 12) outputted from the trans-impedance amplifier 30, in the low frequency range, there is generated voltage $V_t$ corresponding to current obtained by adding drift current and diffusion current; in the high frequency range, there is generated voltage $V_d$ corresponding to only drift current.

Accordingly, when diffusion current is large in the current flowing in the photodiode 20, the voltage signal S10 (FIG. 12) gradually lowers when its pulse falls. This influences the rising of a subsequent pulse, causing an inconvenience in that jitter (a phenomenon of periodical pulse waveform amplitude having a variation) becomes large.

Thus, if the gain of the trans-impedance amplifier 30 in the low frequency range is set to substantially $V_d/V_t$ times the gain in the high frequency range, the amplitude of the voltage signal S10 (FIG. 12) can be reduced in the vicinity of a pulse falling point. Consequently, even when data quantity transmitted per unit time is large, jitter may be reduced.

What is claimed is:

1. A receiving apparatus comprising:
   a light receiving element which receives an optical signal and generates a current signal dependent on the optical signal;
   a conversion unit which converts the current signal into a voltage signal;
   a reference voltage generation unit which generates a reference voltage;
   a threshold voltage generation unit which generates, based on the voltage signal outputted from the conversion unit and the reference voltage outputted from the reference voltage generation unit, a threshold voltage signal having an amplitude smaller than an amplitude of the voltage signal with reference to substantially the center of amplitude range of the voltage signal and delayed by a predetermined time period from the voltage signal; and
   a comparison unit which compares the voltage signal outputted from the conversion unit with the threshold voltage signal outputted from the threshold voltage generation unit,
   wherein the threshold voltage generation unit includes:
   a level shift circuit which converts voltage level of a first input voltage;
   voltage dividing circuit which divides second and third input voltages to generate a divided voltage having voltage level between the second and third input voltages; and
   a delay circuit which delays a fourth input voltage by the predetermined time,
   the voltage signal outputted from the conversion unit being the second input voltage or the fourth input voltage,
   the reference voltage being the first input voltage or the third input voltage, and
   the threshold voltage signal being outputted from the level shift circuit, the voltage dividing circuit or the delay circuit.

2. The receiving apparatus according to claim 1, wherein:
   the level shift circuit raises the voltage signal by an offset voltage;

the voltage dividing circuit divides the voltage signal and reduces a signal level of the voltage signal; and the delay circuit delays the voltage signal by the predetermined time period.

3. The receiving apparatus according to claim 2, wherein the level shift circuit is connected to an output terminal of the reference voltage generation unit, the delay circuit is connected to an output terminal of the conversion unit, and the voltage dividing circuit is connected between an output terminal of the level shift circuit and an output terminal of the delay circuit, and an output terminal of the voltage dividing circuit is connected to an input terminal of the comparison unit.

4. The receiving apparatus according to claim 2, wherein the delay circuit is connected to an output terminal of the conversion unit, the voltage dividing circuit is connected between an output terminal of the delay circuit and an output terminal of the reference voltage generation unit, and the level shift circuit is connected to an output terminal of the voltage dividing circuit, and an output terminal of the level shift circuit is connected to an input terminal of the comparison unit.

5. The receiving apparatus according to claim 2, wherein the level shift circuit is connected to an output terminal of the reference voltage generation unit, the voltage dividing circuit is connected between an output terminal of the conversion unit and an output terminal of the level shift circuit, and the delay circuit is connected to an output terminal of the voltage dividing circuit, and an output terminal of the delay circuit is connected to an input terminal of the comparison unit.

6. The receiving apparatus according to claim 2, wherein the voltage dividing circuit is connected between an output terminal of the conversion unit and an output terminal of the reference voltage generation unit, the delay circuit is connected to an output terminal of the voltage dividing circuit, and the level shift circuit is connected to an output terminal of the delay circuit, and an output terminal of the level shift circuit is connected to an input terminal of the comparison unit.

7. The receiving apparatus according to claim 1, wherein the threshold voltage generation unit includes:

the voltage dividing circuit connected between an output terminal of the conversion unit and an output terminal of the reference voltage generation unit;

a capacitor connected to an output terminal of the voltage dividing circuit; and a current source circuit connected to the output terminal of the voltage dividing circuit, wherein the output terminal of the voltage dividing circuit is connected to an input terminal of the comparison unit.

8. The receiving apparatus according to claim 2, wherein the offset voltage is selected so as to be smaller than a voltage generated by drift current and so that voltage dividing ratio "b" satisfies the formula: $b \geq 1-(V_{O+Vd})/V_t$ where, $V_O$ is the offset voltage, $V_d$ is voltage generated by the drift current, and $V_t$ is voltage generated by the drift current and diffusion current.

9. The receiving apparatus according to claim 8, wherein the offset voltage is so selected that voltage dividing ratio "b" satisfies the formula: $b=1-2V_O/V_t$.

10. The receiving apparatus according to claim 2, wherein the level shift circuit is constituted of a constant current source and a level shift circuit use resistor connected in series and a connection point between the constant current source and the level shift circuit use resistor is connected to an output terminal of the level shift circuit.

11. The receiving apparatus according to claim 2, wherein the voltage dividing circuit is constituted of first and second voltage dividing circuit use resistors connected in series and the connection point between the first and second voltage dividing circuit use resistors is connected to an output terminal of the voltage dividing circuit.

12. The receiving apparatus according to claim 1, wherein the conversion unit is constituted of a trans-impedance amplifier composed of a resistor for the conversion unit connected between an input terminal and an output terminal of an amplifier circuit.

13. The receiving apparatus according to claim 1, wherein the light receiving element is constituted of a photodiode, and an anode of the photodiode is connected to the ground, and a cathode thereof is connected to an input terminal of the conversion unit.

14. The receiving apparatus according to claim 1, wherein the reference voltage generation unit is constituted of a light shielding unit, a dummy photodiode and a dummy trans-impedance amplifier.

* * * * *